United States Patent
Yoshida et al.

(10) Patent No.: US 11,869,781 B2
(45) Date of Patent: Jan. 9, 2024

(54) SUBSTRATE PROCESSING APPARATUS AND SUBSTRATE PROCESSING METHOD

(71) Applicant: Tokyo Electron Limited, Tokyo (JP)

(72) Inventors: Hiroshi Yoshida, Koshi (JP); Hideaki Sato, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 452 days.

(21) Appl. No.: 16/454,236

(22) Filed: Jun. 27, 2019

(65) Prior Publication Data
US 2020/0006094 A1 Jan. 2, 2020

(30) Foreign Application Priority Data

Jun. 29, 2018 (JP) .................................. 2018-124324

(51) Int. Cl.
*H01L 21/67* (2006.01)
*H01L 21/3213* (2006.01)

(52) U.S. Cl.
CPC .. *H01L 21/67086* (2013.01); *H01L 21/32134* (2013.01)

(58) Field of Classification Search
None
See application file for complete search history.

(56) References Cited

U.S. PATENT DOCUMENTS

| | | | | |
|---|---|---|---|---|
| 5,845,660 A * | 12/1998 | Shindo | ............. | H01L 21/67028 134/186 |
| 5,887,602 A * | 3/1999 | Iwama | .................... | B08B 3/00 134/68 |
| 7,756,599 B2 * | 7/2010 | Kudo | ................ | H01L 21/67017 156/345.31 |
| 8,287,751 B1 * | 10/2012 | Hebert | ............. | H01L 21/67057 438/689 |
| 9,027,573 B2 * | 5/2015 | Hyakutake | ........ | H01L 21/67109 134/105 |

(Continued)

FOREIGN PATENT DOCUMENTS

| CN | 103018407 A | 4/2013 |
|---|---|---|
| CN | 104821285 A | 8/2015 |

(Continued)

*Primary Examiner* — Sylvia MacArthur
(74) *Attorney, Agent, or Firm* — Pearne & Gordon LLP

(57) ABSTRACT

A substrate processing apparatus includes a processing tub configured to store therein a processing liquid in which a substrate is immersed to be processed, the processing liquid including a first component and a second component having a boiling point higher than that of the first component; an adjusting liquid supply configured to supply an adjusting liquid configured to adjust a concentration of the second component into the processing tub, the adjusting liquid including the first component; and a controller configured to control the adjusting liquid supply. When changing the concentration, the controller calculates a liquid surface height in the processing tub corresponding to the concentration after being changed based on a concentration difference between the concentration after being changed and the concentration before being changed, and the controller controls a supply of the adjusting liquid into the processing tub based on the calculated liquid surface height.

6 Claims, 8 Drawing Sheets

(56) References Cited

U.S. PATENT DOCUMENTS

| | | | |
|---|---|---|---|
| 9,230,836 B2* | 1/2016 | Higuchi | H01L 21/67248 |
| 2006/0247803 A1* | 11/2006 | Mori | G05B 23/027 |
| | | | 700/80 |
| 2008/0035609 A1* | 2/2008 | Kashkoush | H01L 21/31111 |
| | | | 216/84 |
| 2009/0081881 A1* | 3/2009 | Kiyose | H01L 21/67086 |
| | | | 438/753 |
| 2009/0246968 A1* | 10/2009 | Nakajima | B08B 3/08 |
| | | | 438/745 |
| 2013/0306238 A1* | 11/2013 | Miura | B01F 25/50 |
| | | | 261/119.1 |
| 2014/0073069 A1* | 3/2014 | Takami | H01L 21/32134 |
| | | | 438/14 |
| 2014/0206110 A1* | 7/2014 | Lee | G01N 21/33 |
| | | | 438/16 |
| 2015/0140485 A1* | 5/2015 | Sasa | G03F 7/162 |
| | | | 430/30 |
| 2015/0221530 A1 | 8/2015 | Hara et al. | |
| 2016/0042981 A1* | 2/2016 | Sato | H01L 21/311 |
| | | | 134/18 |
| 2017/0358470 A1* | 12/2017 | Tanaka | H01L 21/67248 |
| 2018/0247841 A1* | 8/2018 | Nagai | H01L 21/67253 |
| 2020/0006094 A1* | 1/2020 | Yoshida | H01L 21/67248 |

FOREIGN PATENT DOCUMENTS

| | | |
|---|---|---|
| CN | 205308201 U | 6/2016 |
| JP | 6118739 B2 | 3/2017 |

* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2018-124324 filed on Jun. 29, 2018, the entire disclosure of which is incorporated herein by reference.

TECHNICAL FIELD

The various aspects and embodiments described herein pertain generally to a substrate processing apparatus and a substrate processing method.

BACKGROUND

An etching processing apparatus described in Patent Document 1 performs an etching processing on a substrate by using a phosphoric acid aqueous solution having a predetermined concentration. The etching processing apparatus includes a processing liquid storage unit configured to store the phosphoric acid aqueous solution therein; a water supply unit configured to supply water to the processing liquid storage unit; and a processing liquid circulating unit configured to circulate the phosphoric acid aqueous solution stored in the processing liquid storage unit. The processing liquid circulating unit includes a concentration sensor configured to detect a concentration of the phosphoric acid aqueous solution. In the etching processing apparatus, the water supply unit supplies pure water corresponding to the amount of water evaporated by heating into the processing liquid storage unit. Accordingly, the etching processing apparatus stores the phosphoric acid aqueous solution of the predetermined concentration in a processing tub of the processing liquid storage unit and etches the substrate by immersing the substrate in this phosphoric acid aqueous solution.

Patent Document 1: Japanese Patent No. 6,118,739

SUMMARY

In one exemplary embodiment, a substrate processing apparatus includes a processing tub configured to store therein a processing liquid in which a substrate is immersed to be processed, the processing liquid including a first component and a second component having a boiling point higher than a boiling point of the first component; an adjusting liquid supply configured to supply an adjusting liquid configured to adjust a concentration of the second component in the processing liquid into the processing tub, the adjusting liquid including the first component; and a controller configured to control the adjusting liquid supply. When changing the concentration, the controller calculates a liquid surface height in the processing tub corresponding to the concentration after being changed based on a concentration difference between the concentration after being changed and the concentration before being changed, and the controller controls a supply of the adjusting liquid into the processing tub based on the calculated liquid surface height.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
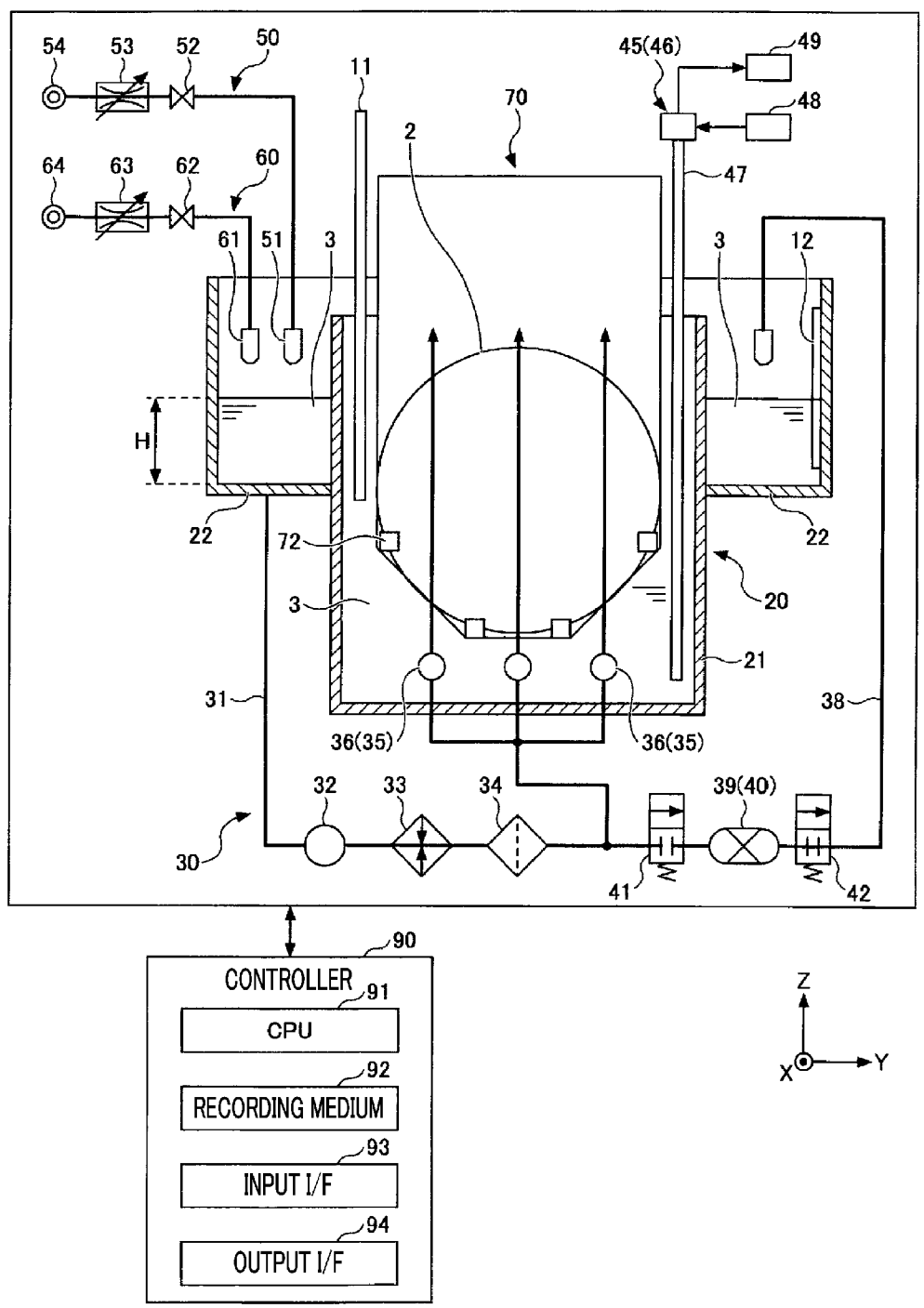
FIG. 1 is a diagram illustrating a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings. In the various drawings, same or corresponding parts will be assigned same or corresponding reference numerals, and redundant description may be omitted. In the following description, the X-axis direction, the Y-axis direction and the Z-axis direction are orthogonal to each other. The X-axis direction and the Y-axis direction are horizontal directions, and the Z-axis direction is a vertical direction. In the present specification, the term "under" means vertically under, and the term "above" means vertically above.

Figure 2:
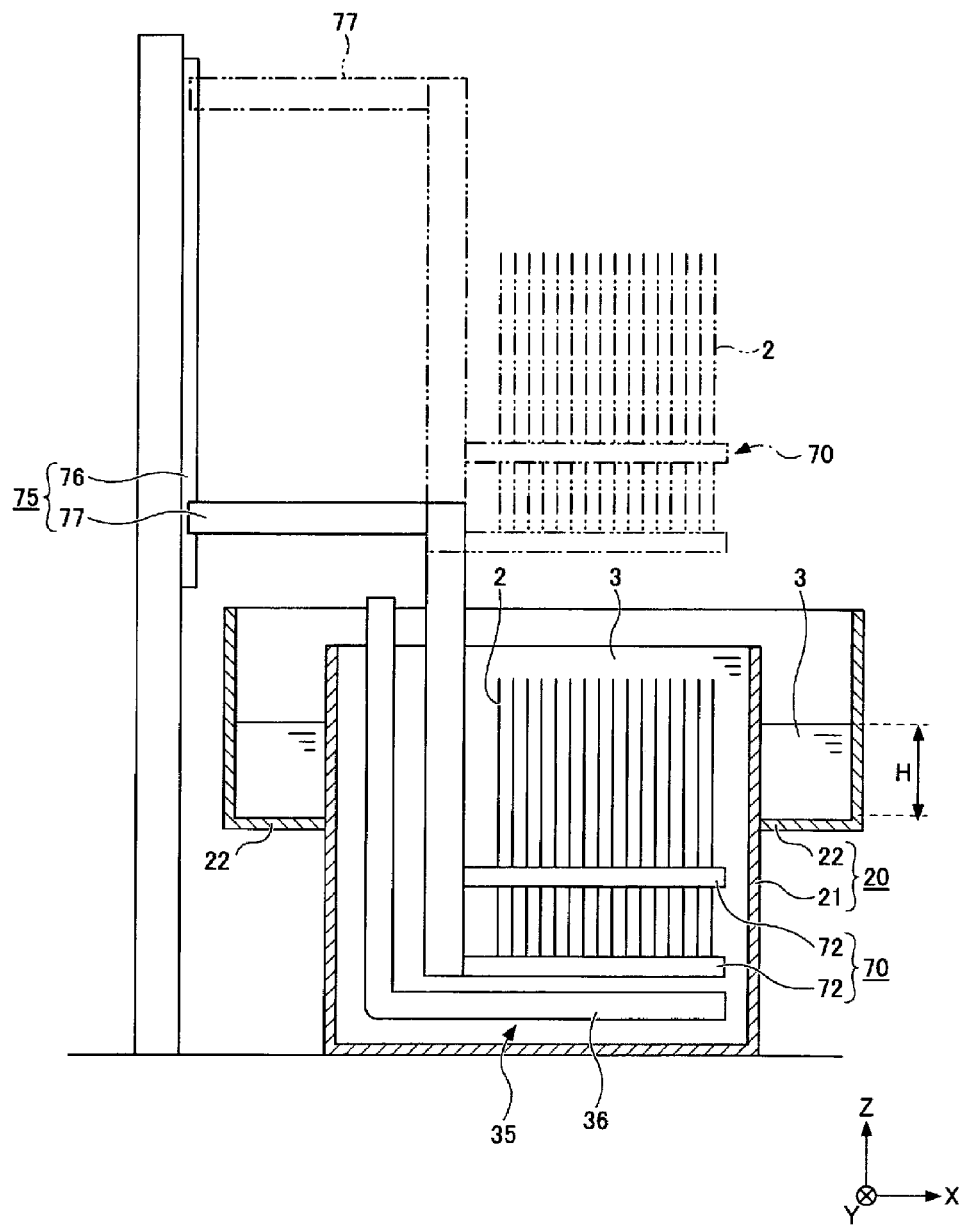
FIG. 2 is a diagram illustrating a processing tub, a substrate holder and a moving mechanism according to the exemplary embodiment.
Figure 3:
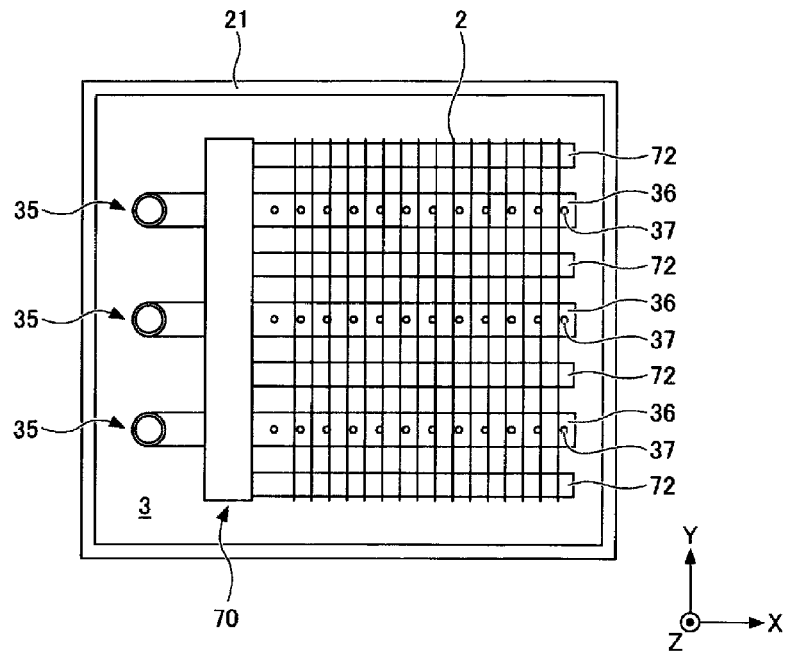
FIG. 3 is a diagram illustrating an inner tub of the processing tub and the substrate holder according to the exemplary embodiment.

FIG. 1 is a diagram illustrating a substrate processing apparatus according to an exemplary embodiment. FIG. 2 is a diagram illustrating a processing tub, a substrate holder and a moving mechanism. FIG. 3 is a diagram illustrating an inner tub of the processing tub and the substrate holder according to the exemplary embodiment.

The substrate processing apparatus 10 is configured to process a substrate 2 by immersing the substrate 2 in a processing liquid 3. The substrate 2 has, by way of example, a silicon wafer, a silicon oxide film and a silicon nitride film. The processing liquid 3 is, for example, a phosphoric acid aqueous solution, and this phosphoric acid aqueous solution is an etching liquid which removes the silicon nitride film selectively between the silicon oxide film and the silicon nitride film. The substrate processing apparatus 10 may process a multiple number of substrates 2 at the same time. The substrate processing apparatus 10 includes, by way of example, a processing tub 20, a processing liquid circulator 30, a source liquid supply 50, an adjusting liquid supply 60, a substrate holder 70, a moving mechanism 75 and a controller 90.

The processing tub 20 stores therein the processing liquid 3 in which the substrate 2 is immersed to be processed. The processing liquid 3 contains, by way of example, a first component and a second component having a boiling point higher than a boiling point of the first component. In case that the processing liquid 3 is the phosphoric acid aqueous solution, the first component is water and the second component is phosphoric acid.

The processing tub 20 is, for example, a dual tub, and includes an inner tub 21 configured to store the processing liquid 3 therein and an outer tub 22 configured to collect the processing liquid 3 overflown from the inner tub 21. The substrate 2 is immersed in and processed by the processing liquid 3 stored in the inner tub 21.

The processing liquid circulator 30 is equipped with a circulation line 31 configured to send the processing liquid 3 from the outer tub 22 into the inner tub 21. A circulation pump 32 configured to send the processing liquid 3, a temperature controller 33 configured to control a temperature of the processing liquid 3 and a circulation filter 34 configured to capture a particle included in the processing liquid 3, and so forth are provided at a part of the circulation line 31.

The temperature controller 33 includes a heater configured to heat the processing liquid 3. Under the control of the controller 90, the temperature controller 33 heats the processing liquid 3 such that a measured temperature from a temperature measurement device 11 becomes a set temperature. The temperature measurement device 11 measures the temperature of the processing liquid 3 stored in the inner tub 21. The temperature measurement device 11 is composed of, by way of non-limiting example, a thermocouple. When the processing liquid 3 is the phosphoric acid aqueous solution, the set temperature of the processing liquid 3 is set to, for example, a boiling point of the phosphoric acid aqueous solution. Further, the temperature controller 33 may further include a cooler configured to cool the processing liquid 3.

The processing liquid circulator 30 is also equipped with a plurality of supply lines 35 which are connected to the circulation line 31. The processing liquid 3 sent from the circulation line 31 is supplied into the inner tub 21 through the supply lines 35. The supply lines 35 are arranged in the Y-axis direction at a regular distance therebetween, as illustrated in FIG. 3, for example. Each supply line 35 has a horizontal portion 36 which is provided horizontally within the inner tub 21, as depicted in FIG. 2, for example.

The horizontal portion 36 is disposed under the substrate holder 70 and is overlapped with the substrate holder 70 when viewed from the vertical direction as shown in FIG. 3. The horizontal portion 36 is extended in the X-axis direction and is provided with discharge openings 37 arranged in a lengthwise direction thereof. These discharge openings 37 are arranged so as not to be overlapped with the substrate holder 70 when viewed from the Z-axis direction.

Each of the discharge openings 37 discharges the processing liquid 3 toward a space directly thereabove. Accordingly, a curtain-shaped up-flow is formed within the inner tub 21. Since a laminar flow is formed within the inner tub 21, the substrate 2 held by the substrate holder 70 can be uniformly processed. To process the substrate 2 more uniformly, the horizontal portion 36 is placed upwardly apart from a bottom wall of the inner tub 21 to allow the substrate 2 and the horizontal portion 36 to be located as closely as possible.

The processing liquid circulator 30 is equipped with a concentration measurement line 38 connected to the circulation line 31, as illustrated in FIG. 1. The processing liquid 3 sent from the circulation line 31 is supplied into the outer tub 22 through the concentration measurement line 38. A concentration meter 39 is provided at a part of the concentration measurement line 38.

The concentration meter 39 is configured to measure a concentration of the second component in the processing liquid 3. The concentration of the second component is, for example, a concentration of the phosphoric acid. The concentration meter 39 has a refractometer 40 configured to measure a refractive index as an index of the concentration of the second component. A relationship between the concentration of the second component and the refractive index is previously calculated through an experiment or the like to be stored in a recording medium 92 of the controller 90 in advance. The concentration of the second component is calculated from the previously stored relationship between the concentration of the second component and the refractive index and the refractive index measured by the refractometer 40.

Further, in case that the processing liquid 3 is composed of the two kinds of components, the effect obtained by measuring the concentration of the second component in the processing liquid 3 is the same as an effect obtained by measuring the concentration of the first component in the processing liquid 3.

A first opening/closing valve 41 and a second opening/closing valve 42 are provided at a part of the concentration measurement line 38 with the concentration meter 39 therebetween. While the concentration meter 39 is measuring the concentration of the second component, the first opening/closing valve 41 and the second opening/closing valve 42 open a path for the processing liquid 3. The concentration meter 39 measures the concentration of the second component while the processing liquid 3 is passing through the concentration measurement line 38. Meanwhile, when the concentration meter 39 does not measure the concentration of the second component, the first opening/closing valve 41 and the second opening/closing valve 42 close the path for the processing liquid 3.

A concentration meter 45 may be further provided in addition to the concentration meter 39. The concentration meter 45 is equipped with a manometer 46 configured to measure a liquid pressure as an index of the concentration of the second component. By way of example, a bubble type liquid-level meter may be used as the manometer 46. Although the bubble type liquid-level meter is typically used to measure a displacement of a liquid surface height, it is used to measure the concentration of the second component here in the exemplary embodiment, and is provided at a place (specifically, within the inner tub 21) where the liquid surface height is maintained constant.

The manometer 46 includes a bubble pipe 47, a purge gas supply unit 48 and a detector 49. The bubble pipe 47 is vertically disposed within the inner tub 21 and has at a lower end portion thereof a discharge opening through which a bubble of a purge gas is discharged. The purge gas supply unit 48 is configured to supply the purge gas into the bubble pipe 47 such that the purge gas is discharged at a regular flow rate from the discharge opening of the bubble pipe 47. The purge gas may be, by way of example, but not limitation, an inert gas such as a nitrogen gas. The detector 49 is configured to detect a back pressure of the purge gas corresponding to a liquid pressure applied to the discharge opening of the bubble pipe 47.

Since the processing liquid 3 is overflown from the inner tub 21 into the outer tub 22, the liquid surface height of the processing liquid 3 is kept constant within the inner tub 21. Since the liquid surface height of the processing liquid 3 is maintained constant, the liquid pressure applied to the discharge opening of the bubble pipe 47 gets larger as a density of the processing liquid 3 is increased. Besides, the density of the processing liquid 3 varies depending on the concentration of the second component. If a density of the second component is higher than a density of the first component, the density of the processing liquid 3 becomes higher as the concentration of the second component is increased. Meanwhile, if the density of the second component is lower than the density of the first component, the density of the processing liquid 3 becomes higher as the concentration of the second component is decreased. A relationship between the concentration of the second component and the liquid pressure is previously calculated through an experiment or the like, and is stored in the recording medium 92 of the controller 90 in advance. The concentration of the second component is obtained from the previously stored relationship between the concentration of the second component and the liquid pressure and the liquid pressure detected by the manometer 46.

The source liquid supply 50 is configured to supply a source liquid into the processing tub 20. The source liquid includes the first component and the second component mixed at a preset mixing ratio. The source liquid may be, by way of example, the phosphoric acid aqueous solution. A concentration of the second component in the source liquid is set based on the concentration of the second component in the processing liquid 3. For example, the concentration of the second component in the source liquid is set to be approximately equal to the concentration of the second component in the processing liquid 3.

The source liquid supply 50 is equipped with, for example, a nozzle 51 configured to supply the source liquid into the processing tub 20. The nozzle 51 is connected to a supply source 54 via an opening/closing valve 52 and a flow rate control valve 53. If the opening/closing valve 52 opens a path for the source liquid, the source liquid is supplied from the nozzle 51 into the outer tub 22. Meanwhile, if the opening/closing valve 52 closes the path for the source liquid, the supply of the source liquid from the nozzle 51 into the outer tub 22 is stopped. The flow rate control valve 53 is configured to adjust a flow rate of the source liquid from the nozzle 51. The supply source 54 supplies the source liquid to the nozzle 51.

The adjusting liquid supply 60 is configured to supply the adjusting liquid into the processing tub 20. The adjusting liquid adjusts the concentration of the second component in the processing liquid 3 and contains the first component. The concentration of the second component in the adjusting liquid is set to be lower than the concentration of the second component in the processing liquid 3. For example, the adjusting liquid only contains the first component. The adjusting liquid may be, by way of example, DIW (Deionized Water). The first component has a boiling point lower than that of the second component so the first component easily evaporates. The adjusting liquid supply 60 is configured to maintain the concentration of the second component in the processing liquid 3 by supplying the adjusting liquid into the processing tub 20 at the same rate as an evaporation rate of the first component from the processing liquid 3.

The adjusting liquid supply 60 may decrease the concentration of the second component in the processing liquid 3 by supplying the adjusting liquid into the processing tub 20 at a rate larger than the evaporation rate of the first component from the processing liquid 3. Further, the adjusting liquid supply 60 may increase the concentration of the second component in the processing liquid 3 by supplying the adjusting liquid into the processing tub 2 at a rate smaller than the evaporation rate of the first component from the processing liquid 3.

The adjusting liquid supply 60 is equipped with a nozzle 61 configured to supply the adjusting liquid into the processing tub 20. The nozzle 61 is connected to a supply source 64 via an opening/closing valve 62 and a flow rate control valve 63. If the opening/closing valve 62 opens a path for the adjusting liquid, the adjusting liquid is supplied from the nozzle 61 into the outer tub 22. Meanwhile, if the opening/closing valve 62 closes the path for the adjusting liquid, the supply of the adjusting liquid from the nozzle 61 into the outer tub 22 is stopped. The flow rate control valve 63 adjusts a flow rate of the adjusting liquid from the nozzle 61. The supply source 64 supplies the adjusting liquid to the nozzle 61.

The supply position to which the adjusting liquid supply 60 supplies the adjusting liquid may not be limited to the outer tub 22. By way of example, the supply position of the adjusting liquid supplied from the adjusting liquid supply 60 may be a part of the circulation line 31. If the adjusting liquid and the processing liquid 3 are mixed, the concentration of the second component in the processing liquid 3 can be adjusted.

The substrate holder 70 is configured to hold the substrate 2. The substrate holder 70 may hold a multiple number of substrates 2 at the same time. The substrate holder 70 is equipped with a plurality of substrate holding rods 72 arranged at a regular distance along the Y-axis direction, as depicted in FIG. 3. Each substrate holding rod 72 is provided with multiple grooves at a regular distance in the X-axis direction, and the substrates 2 are respectively inserted in these grooves. With this configuration, the substrate holder 70 is capable of holding the multiple number of substrates 2 at the regular distance therebetween in an arrangement direction of the discharge openings 37 (in the X-axis direction in the present exemplary embodiment).

The moving mechanism 75 (see FIG. 2) is configured to move the substrate holder 70 with respect to the inner tub 21. The moving mechanism 75 includes: a guide 76 fixed to, for example, the inner tub 21; and a slider 77 configured to move along the guide 76. The substrate holder 70 is fixed to the slider 77, and the substrate holder 70 is moved along with the slider 77. By way of non-limiting example, an electric motor is used as a driving source configured to drive the slider 77, and a rotational motion of the electric motor is converted into a linear motion of the slider 77 by a motion transducer such as a ball screw.

The moving mechanism 75 moves the substrate holder 70 between a processing position indicated by a solid line in FIG. 2 and a standby position indicated by a dashed double-dotted line in FIG. 2. The standby position is set above the processing position. When the substrate holder 70 is located at the processing position, the entire of each of the substrate 2 held by the substrate holder 70 is immersed in the processing liquid 3. Meanwhile, when the substrate holder 70 is placed at the standby position, the entire of each of the substrates 2 held by the substrate holder 70 is exposed to the atmosphere. At the standby position, the substrate holder 70 receives the substrates 2 before being processed from an external transfer device. Then, the substrate holder 70 is lowered to the processing position, and then, is raised back to the standby position after a lapse of a preset time. At the standby position, the substrate holder 70 transfers the substrates 2 after being processed to the external transfer device. Then, the same operations are repeated.

The controller 90 (see FIG. 1) is composed of, for example, a computer, and includes a CPU (Central Processing Unit) 91 and the recording medium 92 such as a memory. The recording medium 92 stores therein a program for controlling various processings performed in the substrate processing apparatus 10. As the CPU 91 executes the program stored in the recording medium 92, the controller 90 controls an operation of the substrate processing apparatus 10. Further, the controller 90 is equipped with an input interface 93 and an output interface 94. The controller 90 receives a signal from the outside through the input interface 93 and transmits a signal to the outside through the output interface 94.

This program may be recorded in a computer-readable recording medium and may be installed from this recording medium to the recording medium 92 of the controller 90. The computer-readable recording medium may be, by way of example, but not limitation, a hard disk (HD), a flexible disk (FD), a compact disk (CD), a magnet optical disk (MO), a memory card, or the like. Further, the program may be installed to the recording medium 92 of the controller 90 by being downloaded from a server through Internet.

Now, a substrate processing method using the substrate processing apparatus 10 will be explained. In the following description, since the processing liquid 3 is the phosphoric acid aqueous solution, the first component is water and the second component is phosphoric acid. In the following description, since the adjusting liquid is water such as DIW, the adjusting liquid contains only the water which is the first component and does not contain the phosphoric acid which is the second component.

Figure 4:
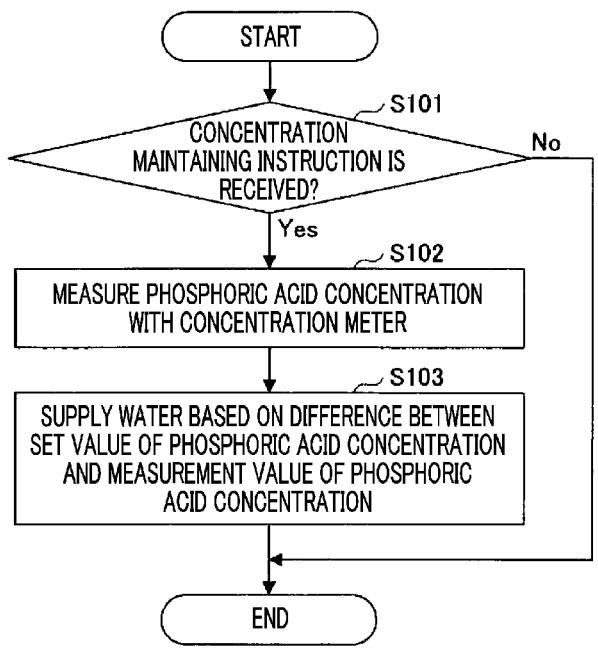
FIG. 4 is a flowchart illustrating a processing of maintaining a concentration of phosphoric acid in a phosphoric acid aqueous solution.

FIG. 4 is a flowchart illustrating a processing of maintaining the concentration of the phosphoric acid in the phosphoric acid aqueous solution according to the exemplary embodiment. The processing shown in FIG. 4 is repeated at a preset time interval under the control of the controller 90.

First, the controller 90 performs a process S101 of determining whether a concentration maintaining instruction is received. The concentration maintaining instruction is an instruction to maintain the concentration of the second component in the processing liquid 3 to a previously determined set value. For instance, the concentration maintaining instruction is an instruction to maintain a concentration C of the phosphoric acid in the phosphoric acid aqueous solution to a previously determined set value. The concentration maintaining instruction may be created by, for example, an external controller.

The concentration maintaining instruction is set to be valid until a concentration changing instruction is received. The concentration changing instruction is an instruction to change the concentration of the second component in the processing liquid 3. For example, the concentration changing instruction is an instruction to change the concentration C of the phosphoric acid in the phosphoric acid aqueous solution. The concentration changing instruction is created by, for example, the external controller.

The external controller sends the concentration maintaining instruction and the concentration changing instruction to the controller 90 at different timings. The timing for the external controller to send the concentration changing instruction to the controller 90 may be set while performing a process of processing the substrate 2 by immersing the substrate 2 in the processing liquid 3, or set before a process of immersing another substrate 2 in the processing liquid 3 and after a process of lifting the substrate 2 up from the processing liquid 3.

If the concentration maintaining instruction is not received (S101, No), the controller 90 ends the current processing as the processing of maintaining the concentration C of the phosphoric acid in the phosphoric acid aqueous solution is not performed. Hereinafter, the concentration C of the phosphoric acid in the phosphoric acid aqueous solution will be simply referred to as "phosphoric acid concentration C".

Meanwhile, if the concentration maintaining instruction is received (S101, Yes), to carry out the processing of maintaining the phosphoric acid concentration C, the controller 90 performs a process S102 of measuring the phosphoric acid concentration C with the concentration meter 39.

The concentration meter 39 has the refractometer 40. The concentration meter 45 may be used instead of the concentration meter 39. The concentration meter 45 has the manometer 46. Further, the phosphoric acid concentration C may be measured by using both the concentration meter 39 and the concentration meter 45.

Subsequently, the controller 90 performs a process S103 of supplying the water as the adjusting liquid into the outer tub 22 from the adjusting liquid supply 60 based on a difference between the set value of the phosphoric acid concentration C and the measurement value of the phosphoric acid concentration C. The set value of the phosphoric acid concentration C is determined according to the concentration maintaining instruction. Meanwhile, the measurement value of the phosphoric acid concentration C is measured in the process S102.

By way of example, the controller 90 performs a feedback control over a supply amount of the water such that the difference between the set value and the measurement value of the phosphoric acid concentration C becomes zero. By way of example, PI control (Proportional Integral Control) or PID control (Proportional Integral Differential Control) may be used as the feedback control.

After the process S103 of supplying the water as the adjusting liquid, the controller 90 ends the current processing.

Figure 5:
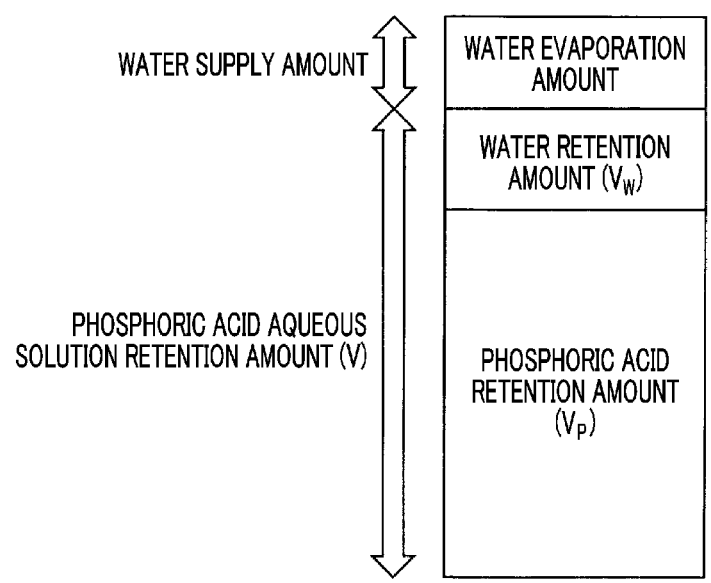
FIG. 5 is a diagram showing a relationship between a retention amount of the phosphoric acid aqueous solution, an evaporation amount of water and a supply amount of the water when maintaining the concentration of the phosphoric acid in the phosphoric acid aqueous solution.

FIG. 5 is a diagram illustrating a relationship between a retention amount of the phosphoric acid aqueous solution, an evaporation amount of the water and a supply amount of the water when maintaining the concentration of the phosphoric acid in the phosphoric acid aqueous solution according to the exemplary embodiment. A retention amount V of the phosphoric acid aqueous solution is a volume of the phosphoric acid aqueous solution stored in the processing tub 20 and the processing liquid circulator 30.

A volume V1 (not shown) of the phosphoric acid aqueous solution stored in the inner tub 21 of the processing tub 20 is constant, and is previously stored in the recording medium 92 of the controller 90. Further, a volume V3 (not shown) of the phosphoric acid aqueous solution stored in the processing liquid circulator 30 is also constant, and is previously stored in the recording medium 92 of the controller 90.

Meanwhile, a volume V2 (not shown) of the phosphoric acid aqueous solution collected in the outer tub 22 of the processing tub 20 varies depending on a liquid surface height H (see FIG. 1) of the phosphoric acid aqueous solution in the outer tub 22. This liquid surface height H is measured by a liquid-level meter 12. The liquid-level meter 12 may be any of various commonly used ones.

A relationship between the liquid surface height H and the volume V2 is previously calculated through an experiment or the like, and is stored in the recording medium 92 of the controller 90 in advance. The controller 90 calculates the volume V2 based on the previously stored relationship between the liquid surface height H and the volume V2 and the measurement value of the liquid surface height H.

The controller 90 outputs a sum (V1+V2+V3) of the volume V2 calculated from the liquid surface height H and the volumes V1 and V3 recorded in the recording medium 92 as the retention amount V of the phosphoric acid aqueous solution. Since the phosphoric acid aqueous solution is composed of the phosphoric acid and the water, the retention amount V of the phosphoric acid aqueous solution equals to a sum $(V_P+V_W)$ of a retention amount $V_P$ of the phosphoric acid and a retention amount $V_W$ of the water, as depicted in FIG. 5.

The controller 90 calculates the retention amount $V_P$ of the phosphoric acid based on the retention amount V of the phosphoric acid aqueous solution and the measurement value of the phosphoric acid concentration C. Further, the controller 90 calculates the retention amount $V_W$ of the water based on the retention amount V of the phosphoric acid aqueous solution and the measurement value of the phosphoric acid concentration C. Here, the phosphoric acid concentration C is measured by the concentration meter 39 or the concentration meter 45.

When calculating the retention amount $V_P$ of the phosphoric acid and the retention amount $V_W$ of the water, the controller 90 converts the unit of the phosphoric acid concentration C from weight % to volume %. In this conversion, a density of the water and a density of the phosphoric acid are used. The density of the water and the density of the phosphoric acid are previously stored in the recording medium 92 of the controller 90 and are read out to calculate the $V_P$ and $V_W$.

During the processing of maintaining the phosphoric acid concentration C, the phosphoric acid is not supplied into the processing tub 20 from the source liquid supply 50 and the adjusting liquid supply 60. Further, since the phosphoric acid has the boiling point higher than that of the water, it is not removed from the processing tub 20 by evaporation. Accordingly, during the processing of maintaining the phosphoric acid concentration C, the retention amount $V_P$ of the phosphoric acid is constant.

Meanwhile, during the processing of maintaining the phosphoric acid concentration C, the water is removed from the processing tub 20 by evaporation, and then, is supplied into the processing tub 20 from the adjusting liquid supply 60. By supplying the water into the processing tub 20 at the same rate as the evaporation rate of the water, the controller 90 maintains the phosphoric acid concentration C. If the evaporation amount of the water per unit time and the supply amount of the water per unit time are same, the phosphoric acid concentration C is maintained constant.

During the processing of maintaining the phosphoric acid concentration C, the evaporation amount of the water per unit time and the supply amount of the water per unit time are same. Therefore, since the retention amount V of the phosphoric acid aqueous solution is constant during the processing of maintaining the phosphoric acid concentration C, the liquid surface height H is also kept constant.

Thus, when using the concentration meter 39 for the control of the phosphoric acid concentration C, the controller 90 may determine whether the concentration meter 39 is out of order based on the measurement value of the liquid-level meter 12. If there is no abnormality in the measurement value of the concentration meter 39, the liquid surface height H falls within a preset range.

By way of example, if the measurement value of the liquid-level meter 12 is below a first threshold value HT1 or exceeds a second threshold value HT2 (HT2>HT1), the controller 90 determines that the concentration meter 39 is out of order. Further, if the measurement value of the liquid-level meter 12 is equal to or larger than the first threshold value HT1 and equal to or less than the second threshold value, the controller 90 makes a determination that the concentration meter 39 is not broken.

Each of the first threshold value HT1 and the second threshold value HT2 may be varied based on the phosphoric acid concentration C. As the phosphoric acid concentration C is decreased, the first threshold value HT1 and the second threshold value HT2 are increased. A relationship between each of the first and second threshold values HT1 and HT2 and the phosphoric acid concentration C is previously set through an experiment or the like to be stored in the recording medium 92 of the controller 90 in advance.

Further, as stated above, the concentration meter 45 may be used for the control of the phosphoric acid concentration C, and the measurement value of the liquid-level meter 12 may be used for the determination of the breakdown of the concentration meter 45.

Further, the controller 90 may decrease the phosphoric acid concentration C of the phosphoric acid aqueous solution by supplying the water into the processing tub 20 at a rate larger than the evaporation rate of the water. Further, the controller 90 may increase the phosphoric acid concentration C of the phosphoric acid aqueous solution by supplying the water into the processing tub 20 at a rate smaller than the evaporation rate of the water.

If the adjusting liquid supply 60 supplies the water into the processing tub 20, it takes time for the supplied water to be diffused and mixed with the phosphoric acid uniformly.

Therefore, if the controller 90 controls the supply amount of the water from the adjusting liquid supply 60 to change the phosphoric acid concentration C while monitoring the phosphoric acid concentration C with the concentration meters 39 and 45, the supply amount of the water may sometimes be excessively large or excessively small. Thus, it may take time for the phosphoric acid concentration C to be stabilized to the changed concentration.

Accordingly, if the controller 90 receives the instruction to change the phosphoric acid concentration C, the controller 90 calculates a liquid surface height HA corresponding to a phosphoric acid concentration CA after being changed based on a concentration difference ΔC (ΔC=CA−CB) between the phosphoric acid concentration CA after being changed and a phosphoric acid concentration CB before being changed. Further, the controller 90 controls the supply amount of the water from the adjusting liquid supply 60 based on the calculated liquid surface height HA.

The liquid surface height HA corresponding to the phosphoric acid concentration CA after being changed remains same before and after the water is diffused and uniformly mixed with the phosphoric acid. Thus, if the supply amount of the water is controlled based on the liquid surface height HA, the phosphoric acid concentration C can be changed from CB to CA accurately, so that the time taken for the phosphoric acid concentration C to be stabilized to CA can be shortened.

Figure 6:
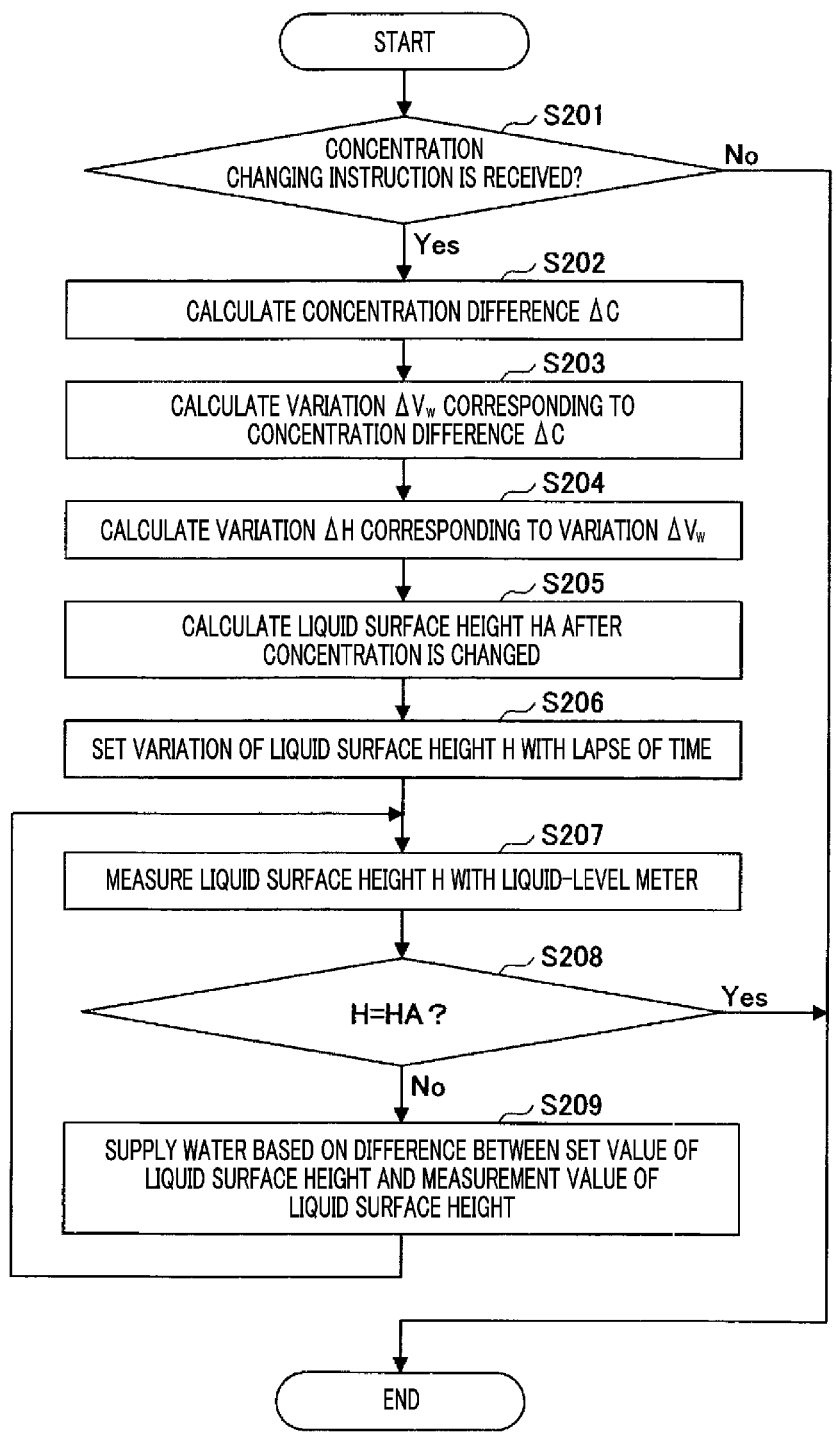
FIG. 6 is a flowchart illustrating a processing of changing the phosphoric acid concentration according to the exemplary embodiment.
Figure 7:
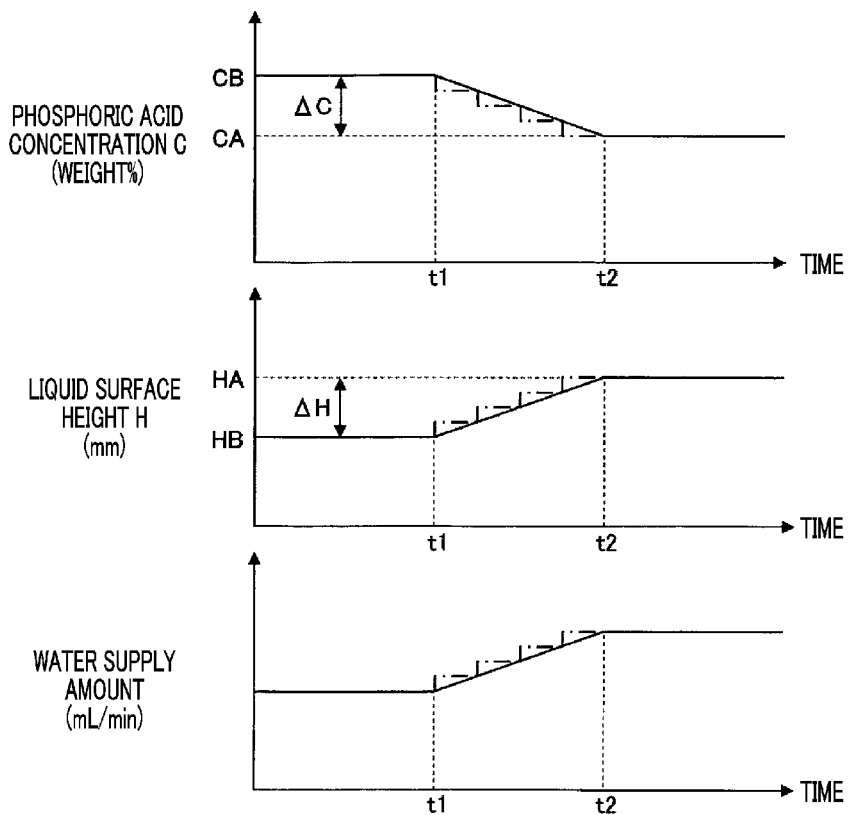
FIG. 7 is a diagram showing a variation of a liquid surface height of the phosphoric acid aqueous solution in an outer tub with a lapse of time and a variation of a supply amount of the water from an adjusting liquid supply with the lapse of time when gradually decreasing the phosphoric acid concentration according to the exemplary embodiment.
Figure 7:
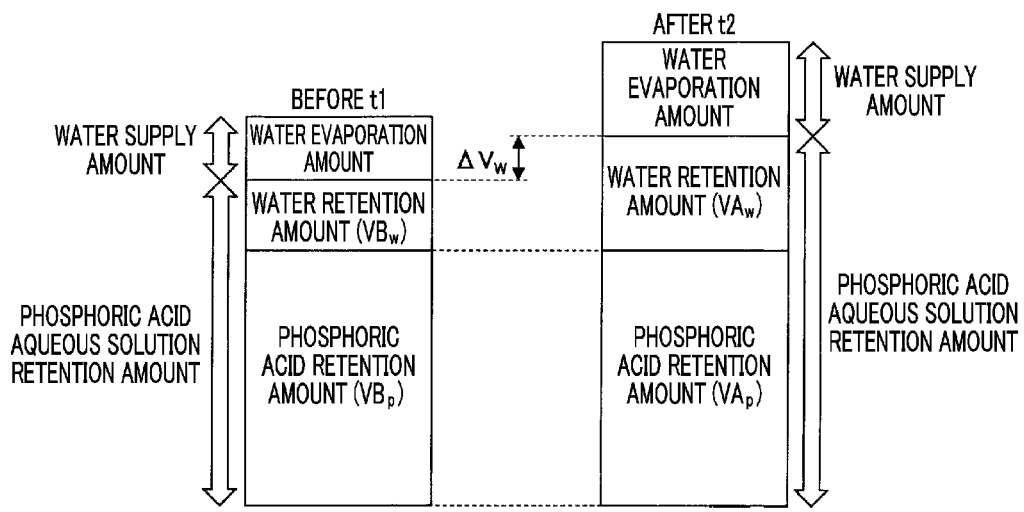
Figure 8:
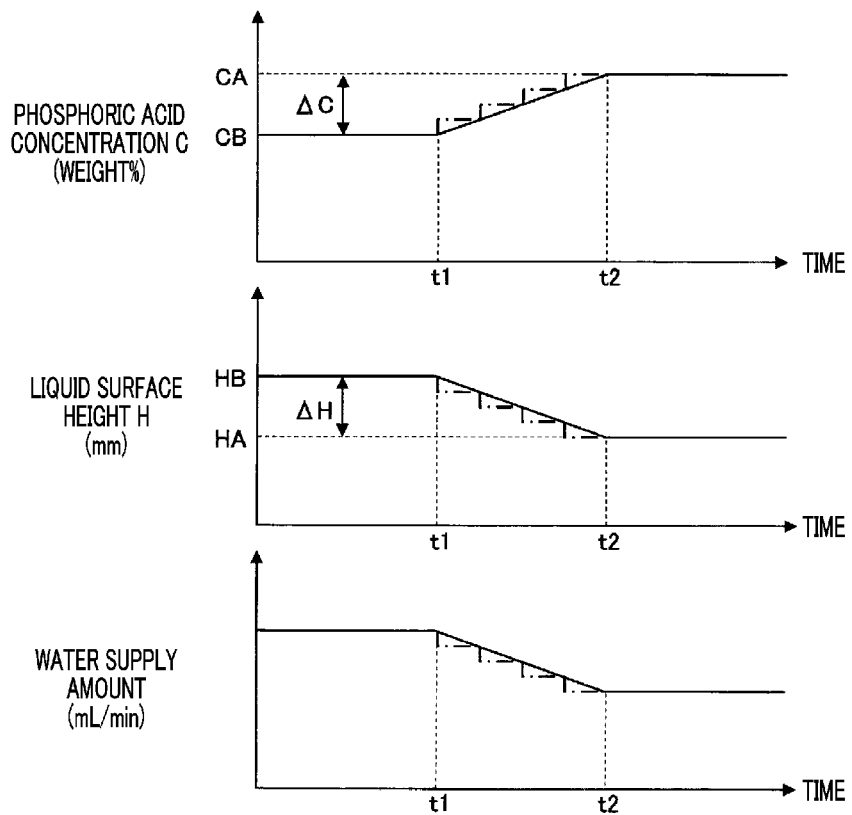
FIG. 8 is a diagram showing a variation of the liquid surface height of the phosphoric acid aqueous solution in the outer tub with a lapse of time and a variation of the supply amount of the water from the adjusting liquid supply with the lapse of time when gradually increasing the phosphoric acid concentration according to the exemplary embodiment.
Figure 8:
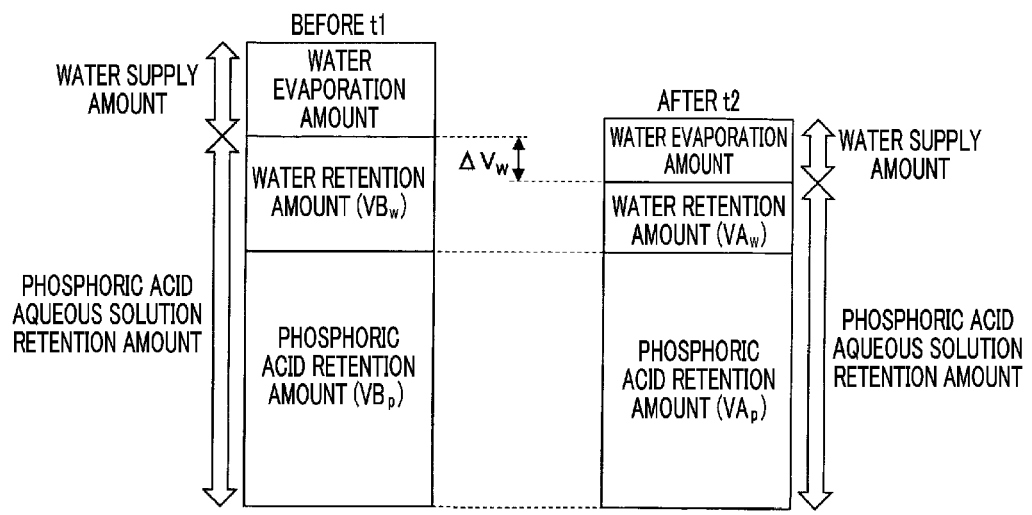

FIG. 6 is a flowchart illustrating the processing of changing the phosphoric acid concentration according to the present exemplary embodiment. The processing shown in FIG. 6 is performed from a time t1 until a time t2 shown in FIG. 7, for example. Further, the processing shown in FIG. 6 is performed from a time t1 until a time t2 shown in FIG. 8. FIG. 7 is a diagram showing a variation of the liquid surface height of the phosphoric acid aqueous solution in the outer tub with a lapse of time and a variation of the supply amount of the water from the adjusting liquid supply with the lapse of time when decreasing the phosphoric acid concentration gradually according to the exemplary embodiment. FIG. 8 is a diagram showing a variation of the liquid surface height of the phosphoric acid aqueous solution in the outer tub with a lapse of time and a variation of the supply amount of the water from the adjusting liquid supply with the lapse of time when increasing the phosphoric acid concentration gradually according to the exemplary embodiment.

First, the controller 90 performs a process S201 of determining whether a concentration changing instruction is received. The concentration changing instruction is, for example, an instruction to change the phosphoric acid concentration C.

If the concentration changing instruction is not received (S201, No), the controller 90 ends the current processing as the processing of changing the phosphoric acid concentration is not performed.

Meanwhile, if the concentration changing instruction is received (S201, Yes), the controller 90 performs a processing of calculating the concentration difference ΔC (ΔC=CA−CB) between the phosphoric acid concentration CA after being changed and the phosphoric acid concentration CB before being changed.

Here, during the processing of changing the phosphoric acid concentration C from CB to CA, the phosphoric acid is not removed from the processing tub 20 by evaporation, and is not supplied into the processing tub 20 from the source liquid supply 50 and the adjusting liquid supply 60. Accordingly, the phosphoric acid retention amount $V_P$ is constant during the processing of changing the phosphoric acid concentration C from CB to CA.

Since the phosphoric acid retention amount $V_P$ is kept constant, the water retention amount $V_W$ and the phosphoric acid concentration C are in a one-to-one correspondence. That is, if the water retention amount $V_W$ is set, the phosphoric acid concentration C is decided, and if the phosphoric acid concentration C is set, the water retention amount $V_W$ is determined. The larger the water retention amount $V_W$ is, the smaller the phosphoric acid concentration C is.

Thus, the controller 90 performs a process S203 of calculating a variation $\Delta V_W$ ($\Delta V_W = VA_W - V_{BW}$) of the water retention amount $V_W$ corresponding to the concentration difference ΔC obtained in the process S202. Here, $VA_W$ denotes the water retention amount $V_W$ corresponding to the phosphoric acid concentration CA after being changed, and $V_{BW}$ refers to the water retention amount $V_W$ corresponding to the phosphoric acid concentration CB before being changed.

The controller 90 converts the unit of the phosphoric acid concentration C from weight % to volume % when calculating $\Delta V_W$ corresponding to ΔC. For this conversion, the density of the water and the density of the phosphoric acid are used. The density of the water and the density of the phosphoric acid are previously stored in the recording medium 92 of the controller 90 and read out to calculate $\Delta V_W$.

Then, the controller 90 performs a process S204 of calculating a variation ΔH (ΔH=HA−HB) of the liquid surface height H in the outer tub 22, which corresponds to the calculated variation $\Delta V_W$ of the water retention amount $V_W$. Here, HA denotes the liquid surface height H corresponding to the phosphoric acid concentration CA after being changed, and HB refers to the liquid surface height H corresponding to the phosphoric acid concentration CB before being changed. The controller 90 calculates the variation ΔH (ΔH=$\Delta V_W$/S) of the liquid surface height H based on the variation $\Delta V_W$ of the water retention amount $V_W$ and an area S of the liquid surface.

Thereafter, the controller 90 performs a process S205 of calculating the liquid surface height HA (HA=ΔH+HB) corresponding to the phosphoric acid concentration CA after being changed based on the variation ΔH of the liquid surface height H calculated in the process S204 and the liquid surface height HB corresponding to the phosphoric acid concentration CB before being changed. Here, the measurement value obtained by the liquid-level meter 12 when the phosphoric acid concentration C is CB is used as the liquid surface height HB corresponding to the phosphoric acid concentration CB before being changed.

Subsequently, the controller 90 performs a process S206 of setting a variation of the liquid surface height H with a lapse of time. By way of example, as indicated by solid lines in FIG. 7 and FIG. 8, the controller 90 changes a setting of the liquid surface height H from HB to HA continuously to change a setting of the phosphoric acid concentration C from CB to CA continuously. Alternatively, as indicated by dashed dotted lines in FIG. 7 and FIG. 8, the controller 90 changes the setting of the liquid surface height H from HB to HA in stages to change the setting of the phosphoric acid concentration C from CB to CA in stages.

Thereafter, the controller 90 performs a process S207 of measuring the liquid surface height with the liquid-level meter 12, and then performs a process S208 of determining whether the liquid surface height H measured in the process S207 is HA.

If the liquid surface height H measured in the process S207 is not HA (S208, No), the phosphoric acid concentration C is not CA. Accordingly, the controller 90 performs a process S209 of supplying the water based on a difference between the set value of the liquid surface height H set in the process S206 and the measurement value of the liquid surface height H obtained in the process S207.

By way of example, the controller 90 performs a feedback control over the supply amount of the water such that the difference between the set value of the liquid surface height H and the measurement value of the liquid surface height H becomes zero. By way of non-limiting example, PI control (Proportional Integral Control) or PID control (Proportional Integral Differential Control) may be used as the feedback control. Thereafter, the controller 90 performs the processing subsequent to the process S207 again.

Meanwhile, if the liquid surface height H measured in the process S207 is HA (S208, Yes), the phosphoric acid concentration C is CA. Thus, the controller 90 ends the current processing. Then, the controller 90 performs the processing shown in FIG. 4 to maintain the phosphoric acid concentration C to be CA.

In the present exemplary embodiment, the controller 90 does not supply the phosphoric acid into the processing tub 20 from the source liquid supply 50 and the adjusting liquid supply 60 during the processing of changing the phosphoric acid concentration C from CB to CA for the purposes of calculating the liquid surface height HA in a simple manner. However, the present disclosure is not limited thereto. The controller 90 may supply the phosphoric acid into the processing tub 20 from the source liquid supply 50 or the adjusting liquid supply 60 during the processing of changing the phosphoric acid concentration C from CB to CA. The controller 90 is capable of correcting the liquid surface height HA corresponding to the phosphoric acid concentration CA after being changed, based on a total supply amount of the phosphoric acid from the time t1 to the time t2.

As stated above, the controller 90 controls the supply of the water from the adjusting liquid supply 60 based on the liquid surface height HA calculated in the process S205 and the measurement value of the liquid-level meter 12 measured in the process S207. Since the controller 90 controls the supply of the water from the adjusting liquid supply 60 while monitoring the measurement value of the liquid-level meter 12, the liquid surface height H can be regulated to HA accurately. Further, since the controller 90 monitors the measurement value of the liquid-level meter 12, the controller 90 is capable of coping with the variation in the evaporation rate of the water which is caused by the change of the phosphoric acid concentration C.

Further, the controller 90 of the present exemplary embodiment controls the supply of the water from the adjusting liquid supply 60 while monitoring the measurement value of the liquid-level meter 12, the present disclosure is not limited thereto. The controller 90 may control the supply of the water from the adjusting liquid supply 60 based on the liquid surface height HA calculated in the process S205, and may not need to monitor the measurement value of the liquid-level meter 12.

By way of example, the controller 90 may calculate the total supply amount [mL] of the water from the time t1 to the time t2 based on the variation ΔH calculated in the process S204, and then, supply the calculated total supply amount of the water from the adjusting liquid supply 60 into the processing tub 20. Here, the total supply amount of the water is calculated by adding a total evaporation amount of the water from the time t1 to the time t2.

The total evaporation amount of the water is obtained by time-integrating the evaporation rate of the water. The evaporation rate of the water may be assumed to be constant from the time t1 to the time t2. For example, the evaporation rate of the water may be assumed to be equal to a feed rate of the water during the processing of constantly maintaining the phosphoric acid concentration C to be CB performed before the time t1.

Furthermore, the controller 90 of the present exemplary embodiment does not allow the supply of the water from the adjusting liquid supply 60 based on the measurement value of the concentration meter 39 during the processing of changing the phosphoric acid concentration C. However, the present disclosure is not limited thereto. The controller 90 may control the supply of the water from the adjusting liquid supply 60 based on the liquid surface height HA calculated in the process S205 and the measurement value of the concentration meter 39.

For example, the controller 90 may control the supply of the water from the adjusting liquid supply 60 based on the liquid surface height HA calculated in the process S205, while monitoring the measurement value of the concentration meter 39. A result of the control over the supply of the water based on the liquid surface height HA calculated in the process S205 can be evaluated.

Meanwhile, during the control of the phosphoric acid concentration C, the concentration meter 39 used for the control of the phosphoric acid concentration C may be broken. Below, a processing performed when the concentration meter 39 is broken will be explained. Further, the concentration meter 45 may be used for the control of the phosphoric acid concentration C. Since a processing performed when the concentration meter 45 is broken is the same as the processing performed when the concentration meter 39 is broken, redundant description will be omitted here.

Figure 9:
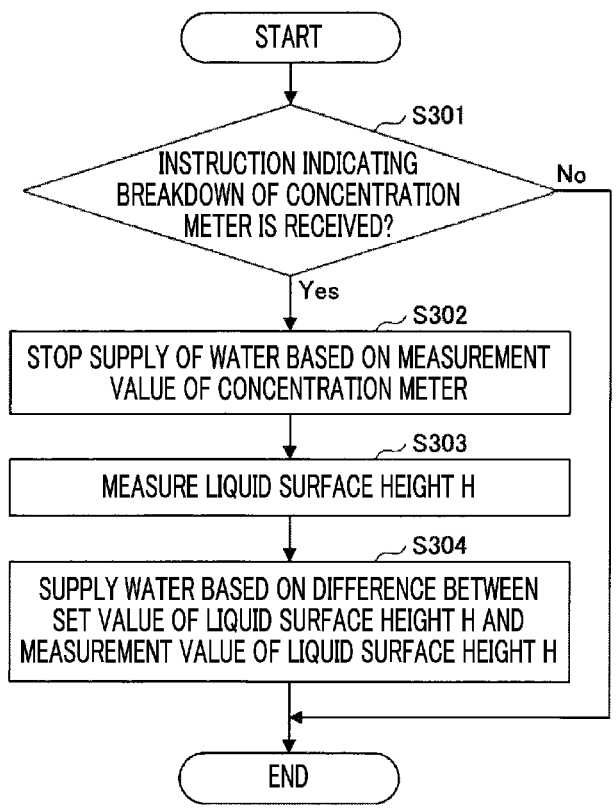
FIG. 9 is a flowchart illustrating a processing performed when a concentration meter is out of order according to the exemplary embodiment.

FIG. 9 is a flowchart illustrating the processing performed when the concentration meter 39 is out of order. The processing shown in FIG. 9 is repeated at a preset time interval under the control of the controller 90, and is performed during the processing of maintaining the phosphoric acid concentration shown in FIG. 4 and during the processing of changing the phosphoric acid concentration shown in FIG. 6.

First, the controller 90 performs a process S301 of determining whether an instruction indicating the breakdown of the concentration meter 39 is received. The breakdown of the concentration meter 39 refers to a state in which a signal indicating the measurement value of the concentration meter 39 is recognized to be abnormal. By way of example, when the signal indicating the measurement value of the concentration meter 39 is not sent for more than a previously preset time, the instruction indicating the breakdown is created. Further, if the measurement value of the concentration meter 39 is below the first threshold value CT1 continuously for more than a preset time, the instruction indicating the breakdown is created. Furthermore, if the measurement value of the concentration meter 39 exceeds the second threshold value CT2 (CT2>CT1) continuously for more than a preset time, the instruction indicating the breakdown is created. The instruction indicating the breakdown may be created by, for example, the external controller, and the external controller sends the instruction of the breakdown to the controller 90.

If the instruction indicating the breakdown of the concentration meter 39 is not received (S301, No), the controller 90 determines that there is no abnormality in the concentration meter 39, and finishes the current processing.

Meanwhile, if the instruction indicating the breakdown of the concentration meter 39 is received (S301, Yes), the controller 90 makes a determination that the concentration meter 39 is broken, and performs a process S302 of stopping the supply of the water from the adjusting liquid supply 60 based on the measurement value of the concentration meter 39.

Subsequently, the controller 90 performs a process S303 of measuring the liquid surface height H with the liquid-level meter 12.

Then, the controller 90 performs a process S304 of supplying the water as the adjusting liquid into the outer tub 22 from the adjusting liquid supply 60 based on a difference between the measurement value of the liquid surface height H measured in the process S303 and the set value of the liquid surface height H, and ends the current processing.

If the controller 90 receives the instruction indicating the breakdown of the concentration meter 39 during the processing of maintaining the phosphoric acid concentration C, the controller 90 adopts the measurement value of the liquid surface height H immediately before the reception of that instruction as the set value of the liquid surface height H in the process S304.

Meanwhile, if the controller 90 receives the instruction indicating the breakdown of the concentration meter 39 during the processing of changing the phosphoric acid concentration C, the controller 90 adopts the set value of the liquid surface height H determined in the process S206 shown in FIG. 6 as the set value of the liquid surface height H in the process S304.

As discussed above, if the controller 90 detects the breakdown of the concentration meter 39, the controller 90 stops the supply of the water into the processing tub 20 based on the measurement value of the concentration meter 39, and performs the supply of the water into the processing tub 20 based on the measurement value of the liquid-level meter 12. Accordingly, in case that the concentration meter 39 is out of order, it is still possible to control the phosphoric acid concentration C accurately.

So far, the exemplary embodiments of the substrate processing apparatus and the substrate processing method according to the present disclosure have been described. However, it should be noted that the exemplary embodiments are not limiting. Various changes, modifications, substitutions, additions and deletions may be made within the scope of the claims, and are included in the inventive scope of the present disclosure.

Although the processing tub 20 in the above-described exemplary embodiment is the dual tub, the present disclosure is also applicable to a single type processing tub. If the processing tub is the single tub, the liquid-level meter 12 measures a liquid surface height of the processing liquid 3 stored in this single tub.

In the above-described exemplary embodiment, the processing liquid 3 is the phosphoric acid aqueous solution containing the water as the first component and the phosphoric acid as the second component. However, the present disclosure is also applicable to a processing liquid other than the phosphoric acid aqueous solution. By way of example, the processing liquid 3 may be ammonia water. In this case, the first component is ammonia and the second component is water.

In case that the processing liquid 3 is the phosphoric acid aqueous solution, the water as the first component is a solvent and the phosphoric acid as the second component is a solute. Meanwhile, in case that the processing liquid 3 is the ammonia water, the ammonia as the first component is the solute and the water as the second component is the solvent. In this way, either of the first component and the second component can be the solute. In case that the first component is the solute and the second component is the solvent, the concentration meters 39 and 45 may measure the concentration of the first component in the processing liquid 3. That is, the concentration meters 39 and 45 need to measure the concentration of the solute.

In the above-described exemplary embodiment, the processing liquid 3 is composed of the two kinds of components. However, the present disclosure is not limited thereto, and the processing liquid may be composed of three or more kinds of components. By way of non-limiting example, the processing liquid 3 may be SC-1 (a cleaning liquid containing ammonium hydroxide, hydrogen peroxide and water).

Though the solvent of the processing liquid 3 in the above-described exemplary embodiment is the water, the solvent of the processing liquid 3 may be an organic solvent.

The substrate 2 in the above-described exemplary embodiment includes the silicon wafer, the silicon oxide film and the silicon nitride film. However, the structure of the substrate 2 is not particularly limited. For example, the substrate 2 may have a silicon carbide substrate, a sapphire substrate or a glass substrate instead of the silicon wafer.

According to the exemplary embodiment, it is possible to accurately change the constituent concentration of the processing liquid in which the substrate is immersed to be processed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
    a processing tub configured to store therein a processing liquid in which a substrate is immersed to be processed, the processing liquid including a first component and a second component having a boiling point higher than a boiling point of the first component;
    an adjusting liquid supply configured to supply an adjusting liquid configured to adjust a concentration of the second component in the processing liquid into the processing tub, the adjusting liquid including the first component;
    a controller configured to control an operation of the substrate processing apparatus;
    a liquid-level meter configured to measure a liquid surface height; and
    a concentration meter configured to measure the concentration,
    wherein when an instruction for changing the concentration is received,
    the controller is configured to calculate the liquid surface height in the processing tub corresponding to the concentration after being changed based on a concentration difference between a set concentration of the second component after being changed and a set concentration of the second component before being changed, and wherein the adjusting liquid supply supplies the adjusting liquid into the processing tub based on the calculated liquid surface height and a measurement value of the liquid-level meter, wherein the concentration meter includes a manometer configured to detect a liquid pressure of the processing liquid as an index of the concentration of the second component, and the manometer includes a bubble pipe configured to discharge a gas to the processing tub, and a detector configured to detect a back pressure of the gas applied to the bubble pipe corresponding to the liquid pressure of the processing liquid, and the concentration meter is further configured to measure the concentration of the second component from the back pressure detected by the detector based on a relationship between the concentration of the second component and the liquid pressure stored in a recording medium.

2. The substrate processing apparatus of claim 1, wherein when maintaining the concentration of the second component, the controller is further configured to control the supply of the adjusting liquid into the processing tub based on a difference between a set value of the concentration of the second component and a measurement value of the concentration meter.

3. The substrate processing apparatus of claim 2, wherein a determination on the concentration meter by the controller is performed when controlling the supply of the adjusting liquid into the processing tub based on the difference between the set value of the concentration of the second component and the measurement value of the concentration meter, the controller determines whether the concentration meter is out of order based on the measurement value of the liquid-level meter.

4. The Substrate processing apparatus of claim 1, wherein when a breakdown of the concentration meter is detected, the controller is further configured to stop the supply of the adjusting liquid into the processing tub based on a measurement value of the concentration meter and perform the supply of the adjusting liquid into the processing tub based on the measurement value of the liquid-level meter.

5. The substrate processing apparatus of claim 1, wherein the concentration meter further includes a refractometer configured to detect a refractive index of the processing liquid as an index of the concentration of the second component.

6. A substrate processing apparatus, comprising:

a processing tub configured to store therein a processing liquid in which a substrate is immersed to be processed, the processing liquid including a first component and a second component having a boiling point higher than a boiling point of the first component;

an adjusting liquid supply configured to supply an adjusting liquid configured to adjust a concentration of the second component in the processing liquid into the processing tub, the adjusting liquid including the first component;

a controller configured to control the adjusting liquid supply;

a liquid-level meter configured to measure a liquid surface height; and a concentration meter configured to measure the concentration, wherein when changing the concentration, the controller is further configured to calculate the liquid surface height in the processing tub corresponding to the concentration after being changed based on a concentration difference between the concentration after being changed and the concentration before being changed, wherein the adjusting liquid supply supplies the adjusting liquid into the processing tub based on the calculated liquid surface height, and wherein the controller is further configured to determine whether the concentration meter is out of order based on a measurement value of the liquid-level meter, wherein the concentration meter includes a manometer configured to detect a liquid pressure of the processing liquid as an index of the concentration, and the manometer includes a bubble pipe configured to discharge a gas to the processing tub, and a detector configured to detect a back pressure of the gas applied to the bubble pipe, and the concentration meter is further configured to measure the concentration from the back pressure detected by the detector based on a relationship between the concentration of the second component and the liquid pressure.

* * * * *